United States Patent
Clevenger et al.

(10) Patent No.: US 10,083,862 B2
(45) Date of Patent: Sep. 25, 2018

(54) PROTECTIVE LINER BETWEEN A GATE DIELECTRIC AND A GATE CONTACT

(71) Applicant: INTERNATIONAL BUSINESS MACHINES CORPORATION, Armonk, NY (US)

(72) Inventors: Lawrence A. Clevenger, Rhinebeck, NY (US); Baozhen Li, South Burlington, VT (US); Kirk D. Peterson, Jericho, VT (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/262,032

(22) Filed: Sep. 12, 2016

(65) Prior Publication Data
US 2018/0076086 A1    Mar. 15, 2018

(51) Int. Cl.
| | |
|---|---|
| *H01L 21/768* | (2006.01) |
| *H01L 29/78* | (2006.01) |
| *H01L 29/66* | (2006.01) |
| *H01L 29/423* | (2006.01) |

(52) U.S. Cl.
CPC .. *H01L 21/76852* (2013.01); *H01L 29/42364* (2013.01); *H01L 29/66545* (2013.01); *H01L 29/66553* (2013.01); *H01L 29/66795* (2013.01); *H01L 29/785* (2013.01)

(58) Field of Classification Search
CPC .............. H01L 21/76852; H01L 29/66795
See application file for complete search history.

(56) References Cited

U.S. PATENT DOCUMENTS

| | | |
|---|---|---|
| 6,830,998 B1 | 12/2004 | Pan et al. |
| 7,033,888 B2 | 4/2006 | Pan et al. |
| 7,867,863 B2 | 1/2011 | Chang |
| 7,902,581 B2 | 3/2011 | Frohberg et al. |
| 8,021,942 B2 | 9/2011 | Wei et al. |
| 8,035,165 B2 | 10/2011 | Yeh et al. |
| 8,053,849 B2 | 11/2011 | Pan et al. |
| 8,084,311 B1 | 12/2011 | Horak et al. |
| 8,232,148 B2 | 7/2012 | Li et al. |
| 8,361,854 B2 | 1/2013 | Tsai et al. |
| 8,481,415 B2 | 7/2013 | Yuan et al. |
| 8,722,523 B2 | 5/2014 | Schloesser et al. |
| 8,778,789 B2 | 7/2014 | Besser et al. |
| 8,785,322 B2 | 7/2014 | Ando et al. |
| 2008/0241575 A1 | 10/2008 | Lavoie et al. |
| 2012/0187420 A1 | 7/2012 | Li et al. |

(Continued)

*Primary Examiner* — Moazzam Hossain
(74) *Attorney, Agent, or Firm* — L. Jeffrey Kelly (57) ABSTRACT

A method of forming a protective liner between a gate dielectric and a gate contact. The method may include; forming a finFET having a replacement metal gate (RMG) on one or more fins, the RMG includes a gate dielectric wrapped around a metal gate, an outer liner is on the sidewalls of the gate dielectric and on the fins; forming a gate contact trench by recessing the gate dielectric and the outer liner below a top surface of the metal gate in a gate contact region; forming a protective trench by further recessing the gate dielectric below a top surface of the outer liner; filling the protective trench with a protective liner; and forming a gate contact in the gate contact trench, where the protective liner is between the gate dielectric and the gate contact.

17 Claims, 12 Drawing Sheets

(56) References Cited

U.S. PATENT DOCUMENTS

2014/0154877 A1* 6/2014 Besser ................ H01L 29/4966
                                                              438/586
2015/0214367 A1    7/2015 Chang et al.
2015/0325574 A1* 11/2015 Huang .............. H01L 29/66545
                                                              257/390
2016/0086805 A1*  3/2016 Xu .................... H01L 21/28079
                                                              257/402

* cited by examiner (A)

PROTECTIVE LINER BETWEEN A GATE DIELECTRIC AND A GATE CONTACT

BACKGROUND

The present invention generally relates to semiconductor device manufacturing, and more particularly to the formation of a protective liner between a gate contact (CB) and a gate dielectric.

Forming electrical contacts to the terminals of integrated circuit transistors becomes more challenging as the transistors become smaller and more complex. Transistor designs such as fin field-effect-transistors (FinFETs) pose new challenges to circuit designers in positioning component structures that are prone to copper poisoning of silicon. Typically, modern technology requires introduction of copper (Cu) material into middle-of-line (MOL) levels to reduce MOL resistance. A Cu fin contact can directly connect to a trench silicide which uses non-Cu material (e.g., W or Co). A Cu gate contact typically connects directly to a metal gate having a gate dielectric (high-k) and work function metal (WFM).

SUMMARY

According to one embodiment of the present invention, a method is provided. The method may include forming a finFET structure having a replacement metal gate (RMG) on one or more fins, the RMG includes a gate dielectric wrapped around a metal gate, an outer liner is on the sidewalls of the gate dielectric and on the fins; forming a first fin contact in a fin contact region, where the first fin contact is directly on the fins; forming a gate contact trench by recessing the gate dielectric and the outer liner below a top surface of the metal gate in a gate contact region; forming a protective trench by further recessing the gate dielectric below a top surface of the outer liner; filling the protective trench with a protective liner; and forming a gate contact in the gate contact trench, where the protective liner is between the gate dielectric and the gate contact.

According to another embodiment of the present invention, a structure is provided. The structure may include one or more replacement metal gates (RMG) covering one or more fins, where the one RMG includes a metal gate and a gate dielectric, the gate dielectric is wrapped around a bottom portion of the metal gate and the gate dielectric is between the metal gate and the fins; a protective liner directly on the gate dielectric and on one or more sidewalls of the metal gate; an outer liner on sidewalls of the protective liner and the gate dielectric, wherein the protective liner and the gate dielectric are between the metal gate and the outer liner; and a gate contact on the metal gate in a gate contact region, wherein at least the protective liner is between the gate contact and the gate dielectric.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor device manufacturing, and more particularly to the formation of a protective liner between a gate contact (CB) and a gate dielectric. Ideally, it may be desirable to form a gate contact and a fin contact during a single deposition process. In the present invention, it may be advantageous to form an additional protective trench between a gate contact and a gate dielectric such that the protective trench can be filled with, for example, silicon nitride (SiN) to prevent copper poisoning. One embodiment by which to form a gate contact with higher reliability is described in detail below referring to the accompanying drawings.

It should be noted, each figure has a top view taken along cross-section line A-A (e.g., top view annotated with the letter "A"), a front fin view taken along cross-section line B-B (e.g., front fin view annotated with the letter "B"), and a front gate view taken along cross-section line C-C (e.g., front gate view annotated with the letter "C"), unless otherwise described.

Figure 1:
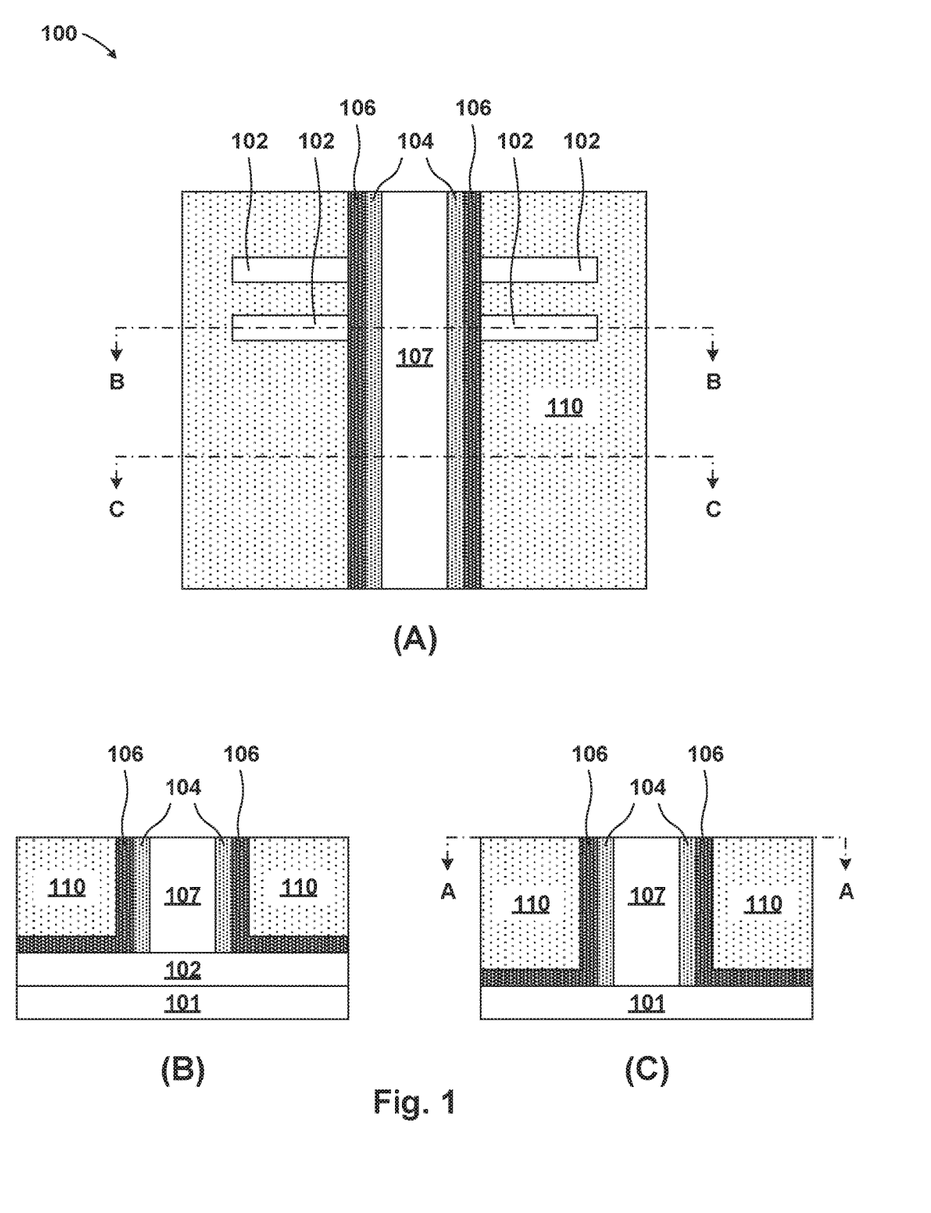
FIG. 1 includes cross section views of a semiconductor structure, the cross sectional views includes a top view (A), a front fin view (B), and a front gate view (C), according to an exemplary embodiment.

FIG. 1 is a demonstrative illustration of a finfet structure 100 during an intermediate step of fabrication, according to one or more embodiments of the present invention. More specifically structure 100 is a FinFET structure having, for example, a dummy gate 107 on one or more fins 102. It should be noted, a single gate structure is illustrated but more than one gate structure may be used (e.g., a double gate or a tri-gate structure).

The fins 102 may be formed, for example, from a bulk substrate or as a top layer of a semiconductor-on-insulator (SOI) substrate. If a bulk substrate is used to form the fins 102 (not shown), the bulk substrate may include any fin material known in the art, such as, for example, Si, Ge, SiGe, or other elemental or compound semiconductors. A shallow trench isolation (STI) may be used to isolate adjacent fins 102, as is known in the art.

In the illustrated embodiment, an SOI substrate is used to form the fins 102. The SOI substrate may include a semiconductor layer (not shown) on an insulation layer 101, and the insulation layer 101 is on a lower substrate. The SOI substrate may be formed using any known SOI substrate formation technique known in the art, such as, for example, Separation by Ion Implantation of Oxygen (SIMOX) or layer transfer. The semiconductor layer may be any material known in the art used for form fins, such as, for example, Si, Ge, SiGe, or other semiconductors. The insulator layer 101 may be any dielectric material known in the art, such as, for example; oxides, nitrides, or oxynitrides. The fins 102 may be formed in the semiconductor layer of the SOI substrate using any fin formation technique known in the art, such as, for example, subtractive etching technique or a sidewall image transfer.

The dummy gate 107 may be formed on the fins 102 using any deposition technique known in the art, such as, for example, atomic layer deposition (ALD), molecular layer deposition (MLD), chemical vapor deposition (CVD), physical vapor deposition (PVD), and spin on techniques followed by deposition, patterning, and etching of a hardmask. The dummy gate 107 may be perpendicular to the fins 102, as depicted in FIG. 1. The dummy gate 107 may be any suitable dummy gate material known in the art, such as, for example, polysilicon or amorphous silicon. In an embodiment, the dummy gate 107 is polysilicon.

A gate spacer 104 may be formed on the sidewalls of the dummy gate 107 using any spacer formation technique known in the art, such as, for example, chemical vapor deposition, plasma enhanced chemical vapor deposition, or atomic layer deposition. In an embodiment, the gate spacer 104 is conformally formed on all exposed surfaces of structure 100 and selectively etched, leaving the gate spacer 104 on the sidewalls of the dummy gate 107. The gate spacer 104 may be any spacer material know in the art, such as, for example, an oxide or a nitride. In an embodiment, the gate spacer 104 is a low-k spacer.

An outer liner 106 may be formed on the gate spacer 104, the fins 102, and the insulator layer 101 using any liner formation technique known in the art, such as, for example, a process similar to the formation of the gate spacer 104. The outer liner 106 may be any liner material know in the art, such as, for example, an oxide or a nitride. In an embodiment, the outer liner 106 is SiN.

A first inter-layer dielectric (ILD) layer 110 may be formed on the outer liner 106 using any techniques known in the art, such as, for example; thermal or plasma oxidation or nitridation, chemical vapor deposition (CVD), and/or physical vapor deposition (PVD). The first ILD layer 110 may be any dielectric material known in the art, such as, for example; oxides, nitrides, or oxynitrides. In an embodiment, the first ILD layer 110 is an oxide, such as, for example, silicon dioxide. It should be noted, the fins 102 are below the outer liner 106 and the first ILD layer 110 but are illustrated in each top view throughout the figures for demonstrative purposes.

Figure 2A:
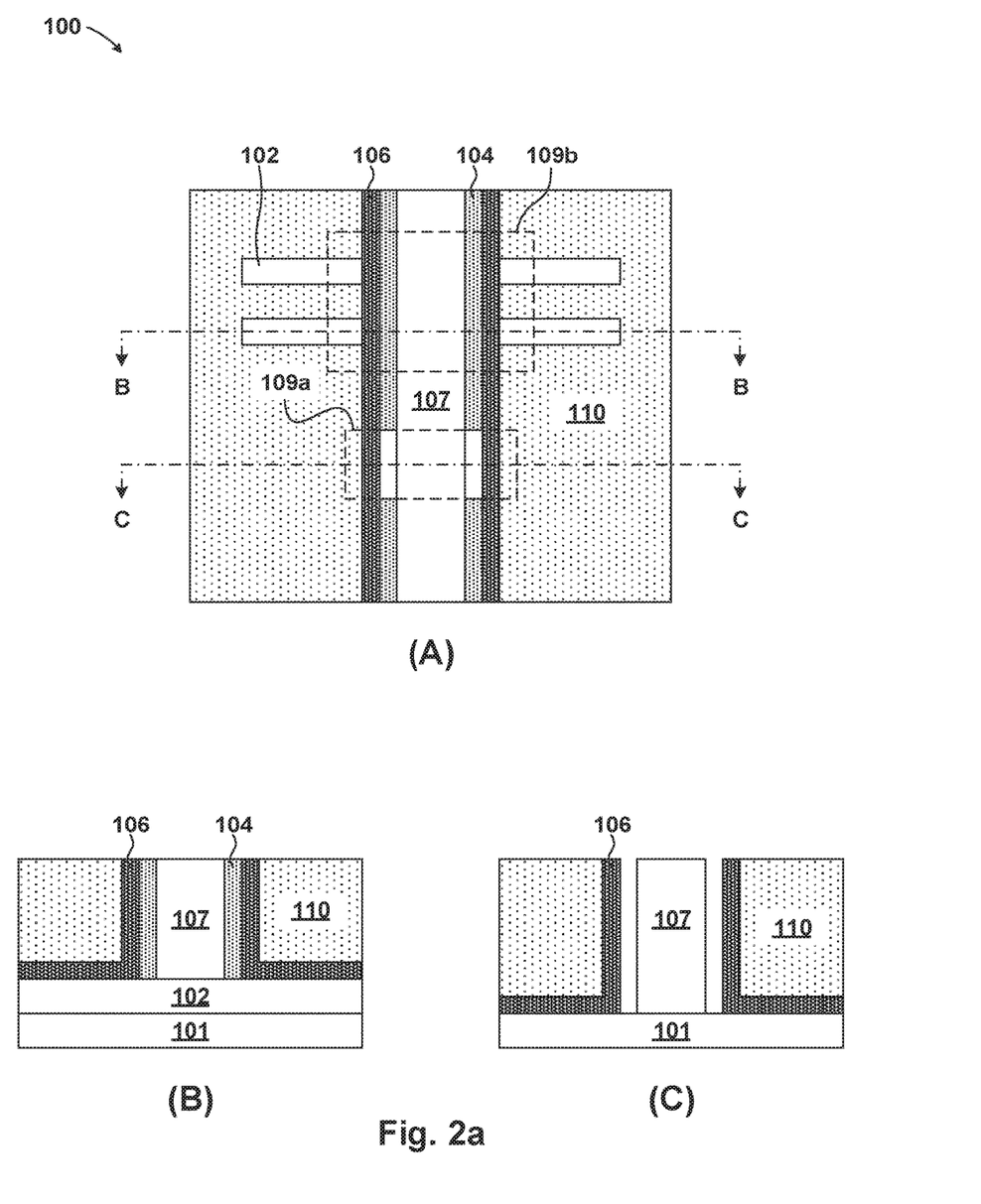
FIG. 2a is the cross section views of the semiconductor structure and illustrates the removal of a gate spacer from a gate contact region, according to an exemplary embodiment.

FIG. 2a is a demonstrative illustration of the structure 100 during an intermediate step of fabrication, according to one or more embodiments of the present invention. More specifically, the gate spacer 104 is removed from a gate contact region 109a.

The gate contact region 109a is where a gate contact will be formed during subsequent processing steps described further below. A fin contact region 109b is where a fin contact will be formed during subsequent processing steps described further below. The gate contact region 109a and the fin contact region 109b are not directly next to each other (i.e., the gate contact will not directly contact the fin contact once formed). The gate spacer 104 may be removed from the gate contact region 109a using any etching technique known in the art, such as, for example, a mask and etching process.

Figure 2B:
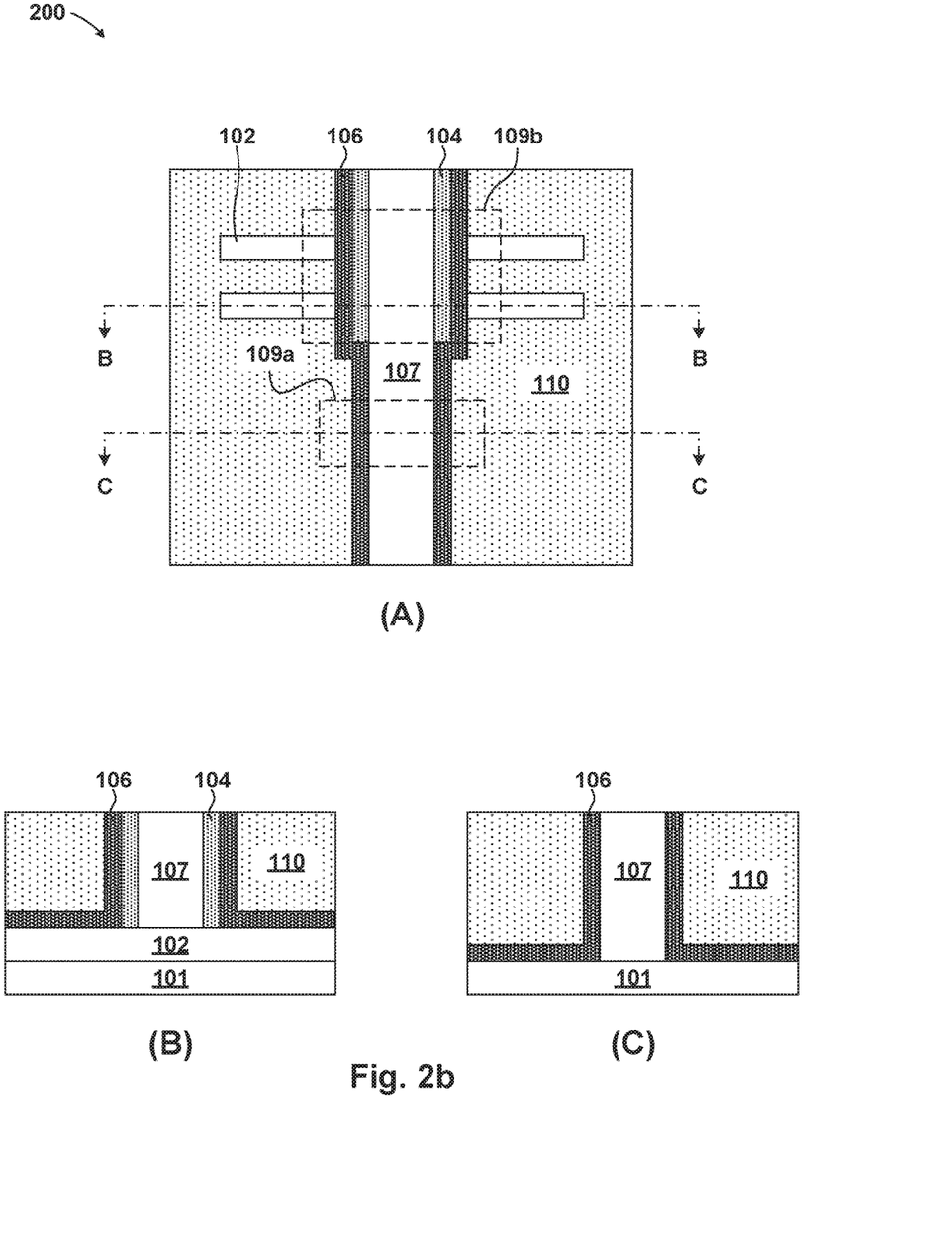
FIG. 2b is the cross section views of an alternative semiconductor structure and illustrates the removal of a gate spacer from regions other than a fin contact region, according to an exemplary embodiment.

FIG. 2b is a demonstrative illustration of a structure 200 during an intermediate step of fabrication, according to one or more embodiments of the present invention. More specifically, structure 200 illustrates another embodiment where the gate spacer 104 is removed from regions other than the fin region 109b (which may include more than just the gate contact region 109a). It should be noted, all elements of structure 200 may be the same or similar to structure 100 and subsequent processing steps, described below, may be performed on more than one embodiment of the present invention.

The gate spacer 104 may be removed from regions other than the fin contact region 109b using any etching technique known in the art, such as, for example, a mask and etching technique. Additionally, the outer liner 106 may be formed around the gate spacer 104 in the fin contact region 109b and along the dummy gate 107 in the other regions.

In yet another embodiment, the gate spacer 104 is not removed from the gate contact region 109a. If the gate spacer 104 is not removed from the gate contact region 109a the gate spacer 104 may be subsequently recessed with a gate dielectric to form a protective trench, as will be described further below.

Figure 3:
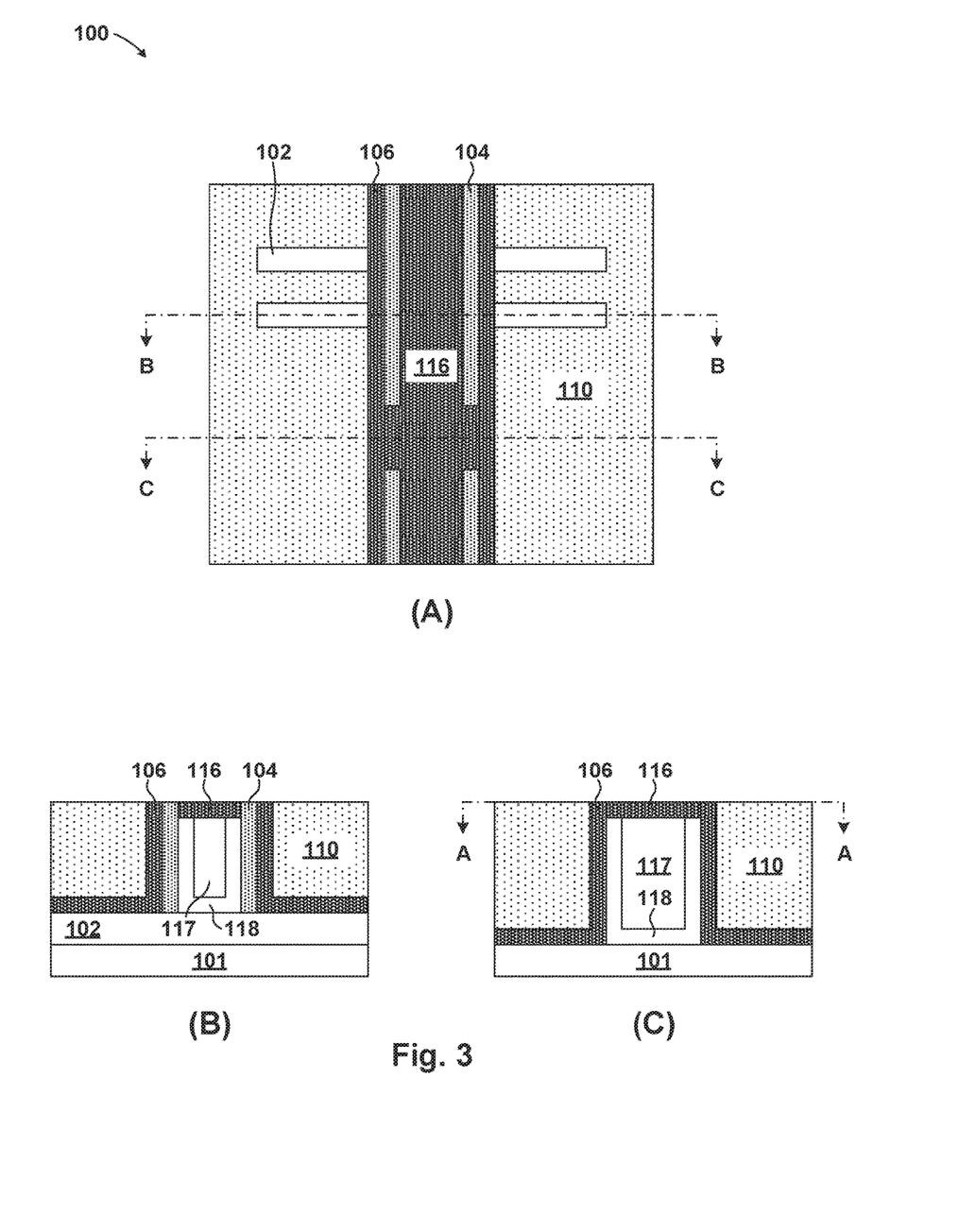
FIG. 3 is the cross section views of the semiconductor structure and illustrates the replacement of a dummy gate structure with a replacement metal gate (RMG), according to an exemplary embodiment.

FIG. 3 is a demonstrative illustration of the structure 100 during an intermediate step of fabrication, according to one or more embodiments of the present invention. More specifically, the dummy gate 107 is replaced with a replacement metal gate (RMG).

The dummy gate 107 may be removed using any dummy gate removal technique known in the art. It should be noted, in an alternative embodiment, the dummy gate 107 may be removed before the removal of the gate spacer 104 described with reference to FIGS. 2a and 2b.

The RMG may be formed in place of the dummy gate 107 using any RMG formation techniques known in the art. The RMG includes a metal gate 117 and a gate dielectric 118. The gate dielectric 118 may be conformally deposited on the surface of a trench resulting after the removal of the dummy gate 107. The gate dielectric 118 may be formed using any deposition technique known in the art, for example, atomic layer deposition (ALD), molecular layer deposition (MLD), chemical vapor deposition (CVD), deposition, physical vapor deposition (PVD). Additionally, the gate dielectric 118 may also be formed using oxidation. The gate dielectric 118 may include high-k materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. In an embodiment, a work function metal (WFM) (not shown) may be formed on the gate dielectric 118, as is known in the art.

The metal gate 117 may be formed on the gate dielectric 118 (or the WFM if used) using any technique known in the art, such as, for example, atomic layer deposition (ALD), molecular layer deposition (MLD), chemical vapor deposition (CVD), or physical vapor deposition (PVD). The metal gate 117 may include, for example, Zr, W, Ta, Hf, Ti, Al, Ru, Pa, metal oxide, metal carbide, metal nitride, transition metal aluminides (e.g. Ti3Al, ZrAl), TaC, TiC, TaMgC, and any combination therein.

A cap 116 may be formed on the RMG and polished to have a top surface that is coplanar with the outer liner 106 and/or the first ILD layer 110. In an embodiment, the cap 116 is SiN.

Figure 4:
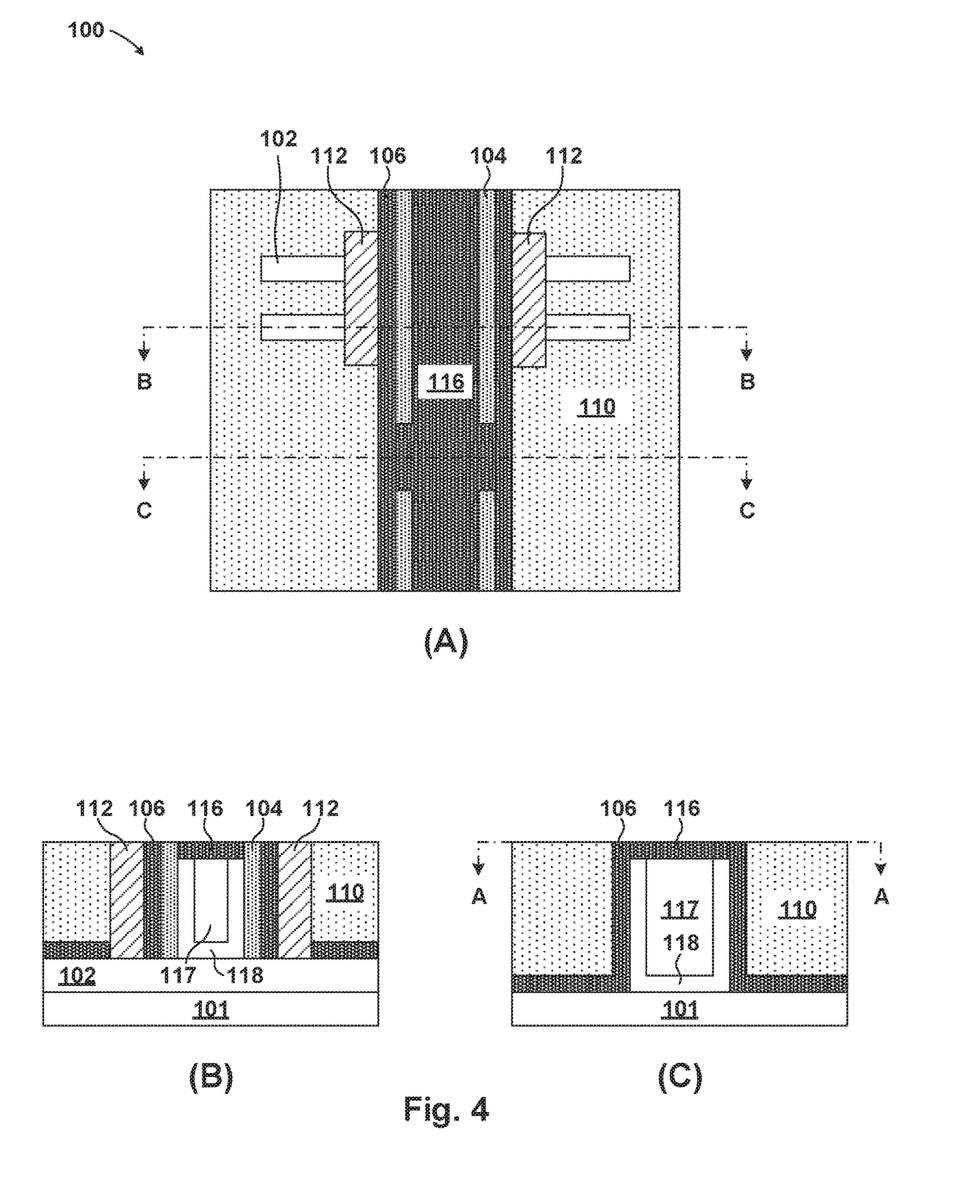
FIG. 4 is the cross section views of the semiconductor structure and illustrates the formation of a first fin contact contacting a plurality of fins through a first ILD and an outer liner, according to an exemplary embodiment.

FIG. 4 is a demonstrative illustration of the structure 100 during an intermediate step of fabrication, according to one or more embodiments of the present invention. More specifically, a first fin contact 112 may be formed in the fin contact region 109b.

A fin trench may be formed through the first ILD 110 and through the outer liner 106 in the fin contact region 109b using any etching technique known in the art, such as a mask and etching process. The first fin contact 112 may be formed in the fin trench using any deposition technique known in the art. The first fin contact 112 may be deposited directly on the fin in the fin contact region 109b. The first fin contact 112 may be any contact material known in the art, such as, for example, tungsten or a silicide. In an embodiment, the first fin contact 112 is a trench silicide.

Figure 5:
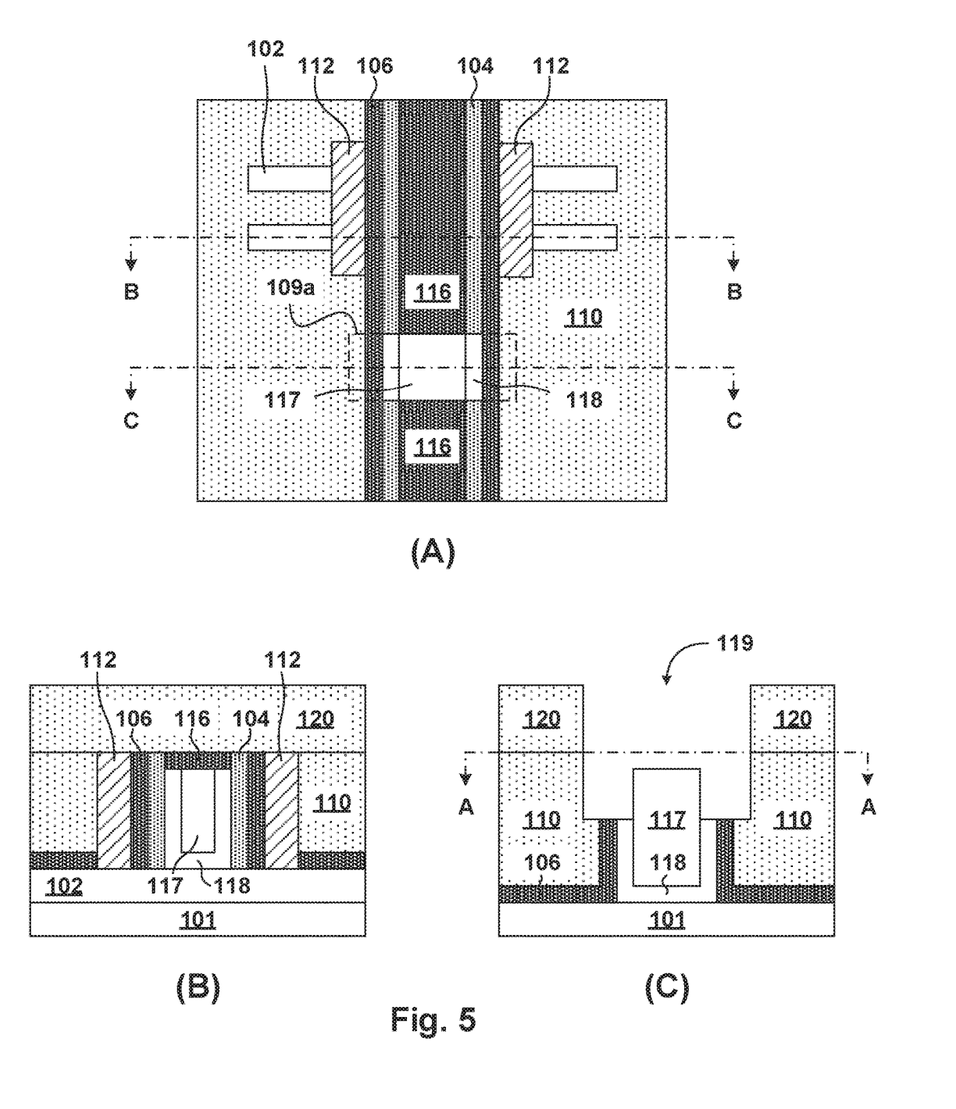
FIG. 5 is the cross section views of the semiconductor structure and illustrates the formation of a gate contact trench, according to an exemplary embodiment.

FIG. 5 is a demonstrative illustration of the structure 100 during an intermediate step of fabrication, according to one or more embodiments of the present invention. More specifically, a gate contact trench 119 is formed in the gate contact region 109a.

A second ILD layer 120 may be formed on the structure 100 using any deposition technique known in the art, such as, for example; thermal or plasma oxidation or nitridation, chemical vapor deposition (CVD), and/or physical vapor deposition (PVD). The second ILD layer 120 may be any dielectric material known in the art, such as, for example; oxides, nitrides, or oxynitrides. In an embodiment, the second ILD layer 120 is the same material as the first ILD layer 110, which may be, for example, silicon dioxide.

The gate contact trench 119 may be formed by removing the second ILD 120 and the cap 116 from the gate contact region 109a and recessing the top surface of the first ILD 110, the outer liner 106, and the gate dielectric 118 in the gate contact region 109a. A top surface and two sidewalls of the metal gate 117 may be exposed above the recessed surface of the first ILD 110, the liner outer 106, and the gate dielectric 118. The gate contact trench 119 may be formed using any etching technique known in the art, such as, for example, a mask and etching process selective to the second ILD 120 and the metal gate 117.

Figure 6:
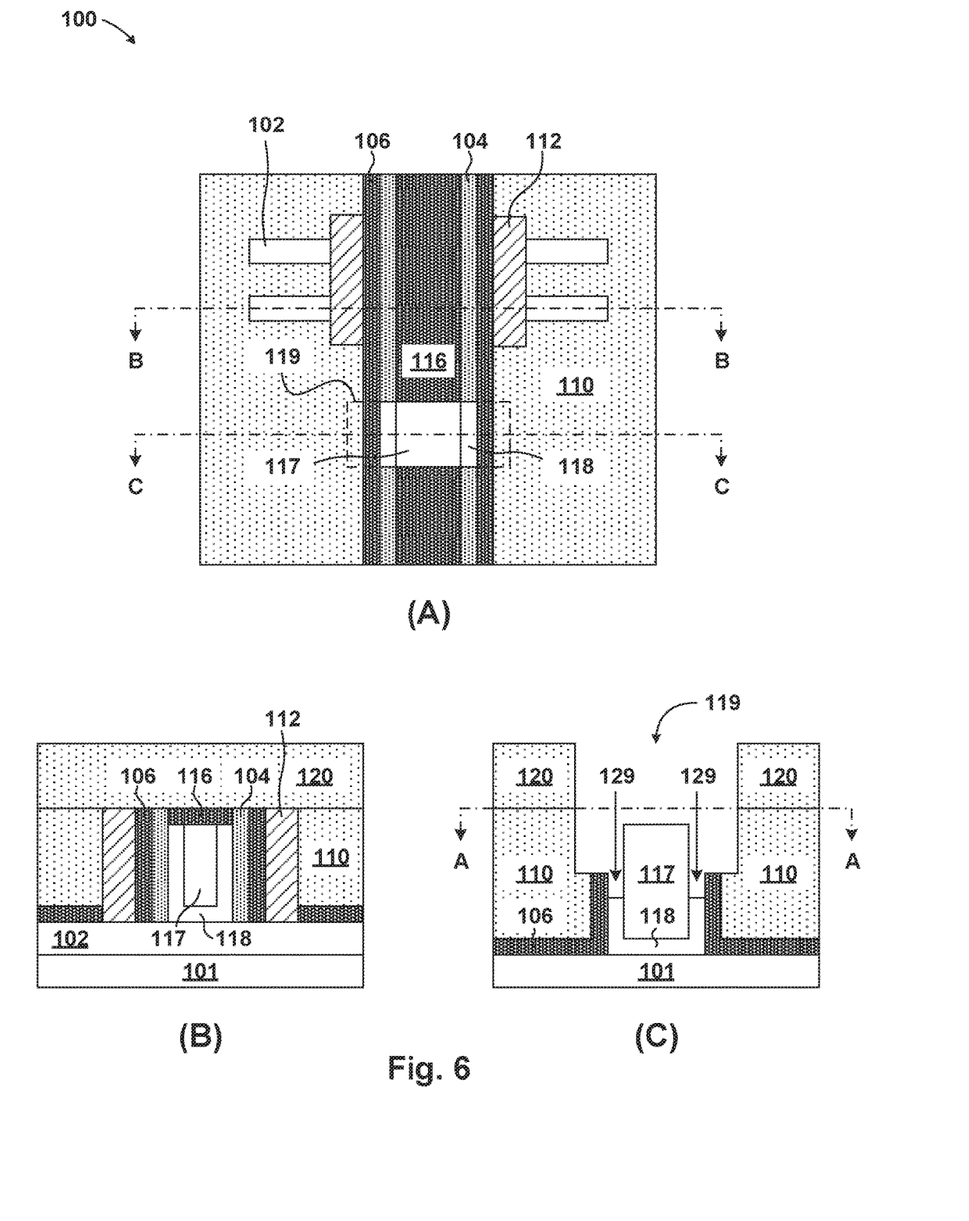
FIG. 6 is the cross section views of the semiconductor structure and illustrates the formation of a protective trench in the gate contact trench, according to an exemplary embodiment.

FIG. 6 is a demonstrative illustration of the structure 100 during an intermediate step of fabrication, according to one or more embodiments of the present invention. More specifically, a protective trench 129 may be formed in the gate contact trench 119 by recessing the gate dielectric 118. The protective trench 129 may provide additional space for a protective liner to be formed between the gate dielectric 118 and a subsequently formed gate contact, as will be discussed further below. If the gate spacer 104 is not removed from the gate contact region 109a (as described above), the protective trench 129 may be formed by recessing the gate dielectric 118 and the gate spacer 104 in the gate contact region 109a.

Figure 7:
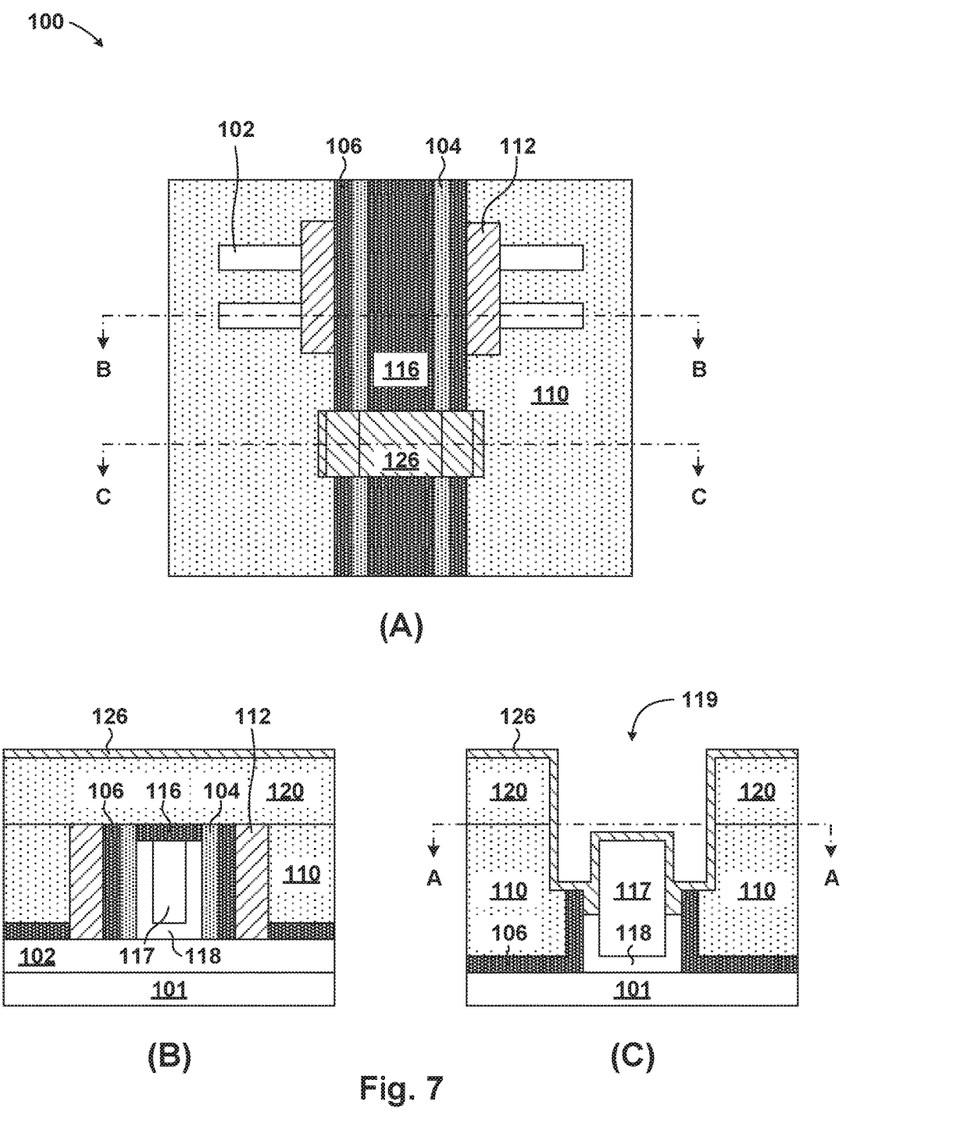
FIG. 7 is the cross section views of the semiconductor structure and illustrates the formation of a protective liner layer, according to an exemplary embodiment.

FIG. 7 is a demonstrative illustration of the structure 100 during an intermediate step of fabrication, according to one or more embodiments of the present invention. More specifically, a protective liner 126 is formed on the second ILD 120 and in the gate contact trench 119.

The protective liner 126 may be formed on the second ILD 120 and in the gate contact trench 119 using any deposition technique known in the art, such as, for example, atomic layer deposition (ALD), molecular layer deposition (MLD), chemical vapor deposition (CVD), in-situ radical assisted deposition, metalorganic chemical vapor deposition (MOCVD), or any combination thereof. The protective liner 126 may include any liner materials known in the art, such as, for example, silicon dioxides, silicon nitrides, silicon oxynitrides, or other dielectric materials. In an embodiment, the protective liner 126 is SiN. The protective liner 126 may have a thickness great enough to pinch off the protective trench 129 (e.g., having a thickness≥half the thickness of the gate dielectric 118).

Figure 8:
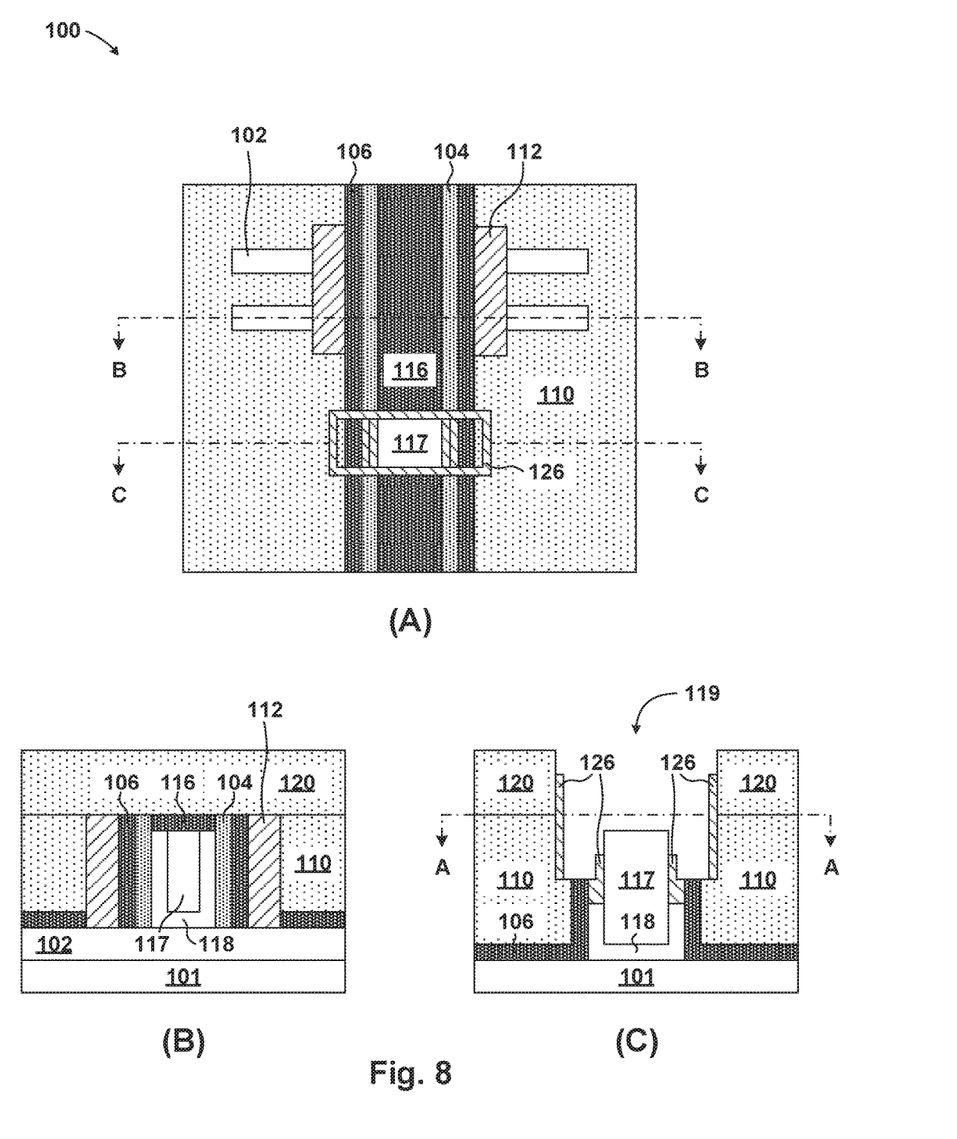
FIG. 8 is the cross section views of the semiconductor structure and illustrates the etching of the protective liner from horizontal surfaces, according to an exemplary embodiment.

FIG. 8 is a demonstrative illustration of the structure 100 during an intermediate step of fabrication, according to one or more embodiments of the present invention. More specifically, the protective liner 126 may be selectively etched exposing the top surface of the metal gate 117 while remaining in the protective trench 129.

The protective liner 126 may be selectively etched to the second ILD 120, the metal gate 117, and the first ILD 110 using any etching technique known in the art, such as, for example, an anisotropic etching technique, such that a portion of the protective liner 126 remains on a portion of the gate contact trench 119 and on a portion of the gate sidewalls. In an embodiment, the protective liner 126 remains entirely in the protective trench 129 after the selective etching process.

Figure 9:
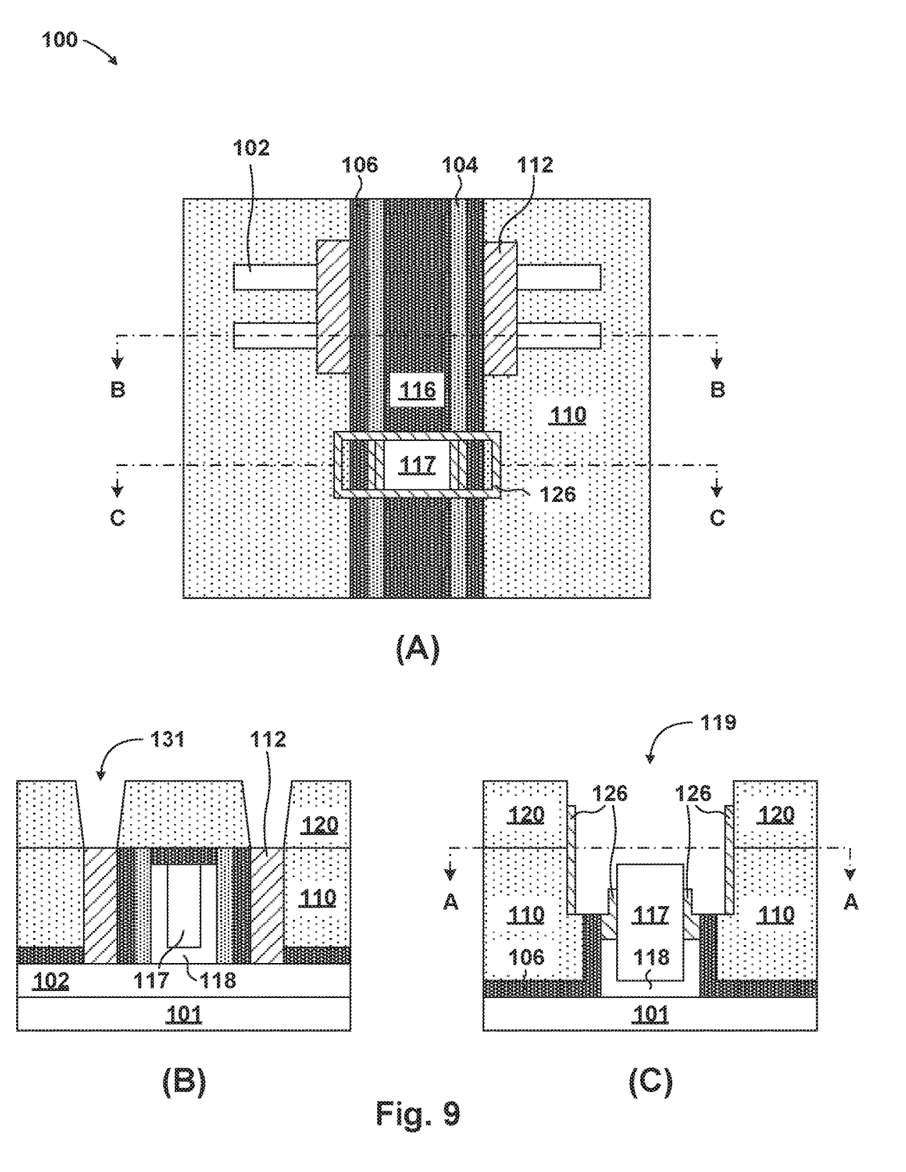
FIG. 9 is the cross section views of the semiconductor structure and illustrates the formation of fin contact trenches in a second ILD, according to an exemplary embodiment.

FIG. 9 is a demonstrative illustration of the structure 100 during an intermediate step of fabrication, according to one or more embodiments of the present invention. More specifically, a fin contact trench 131 may be formed in the second ILD 120 exposing a top surface of the first fin contact 112. The fin contact trench 131 may be formed in the second ILD 120 using any etching technique known in the art, such as a mask and etch process.

Figure 10:
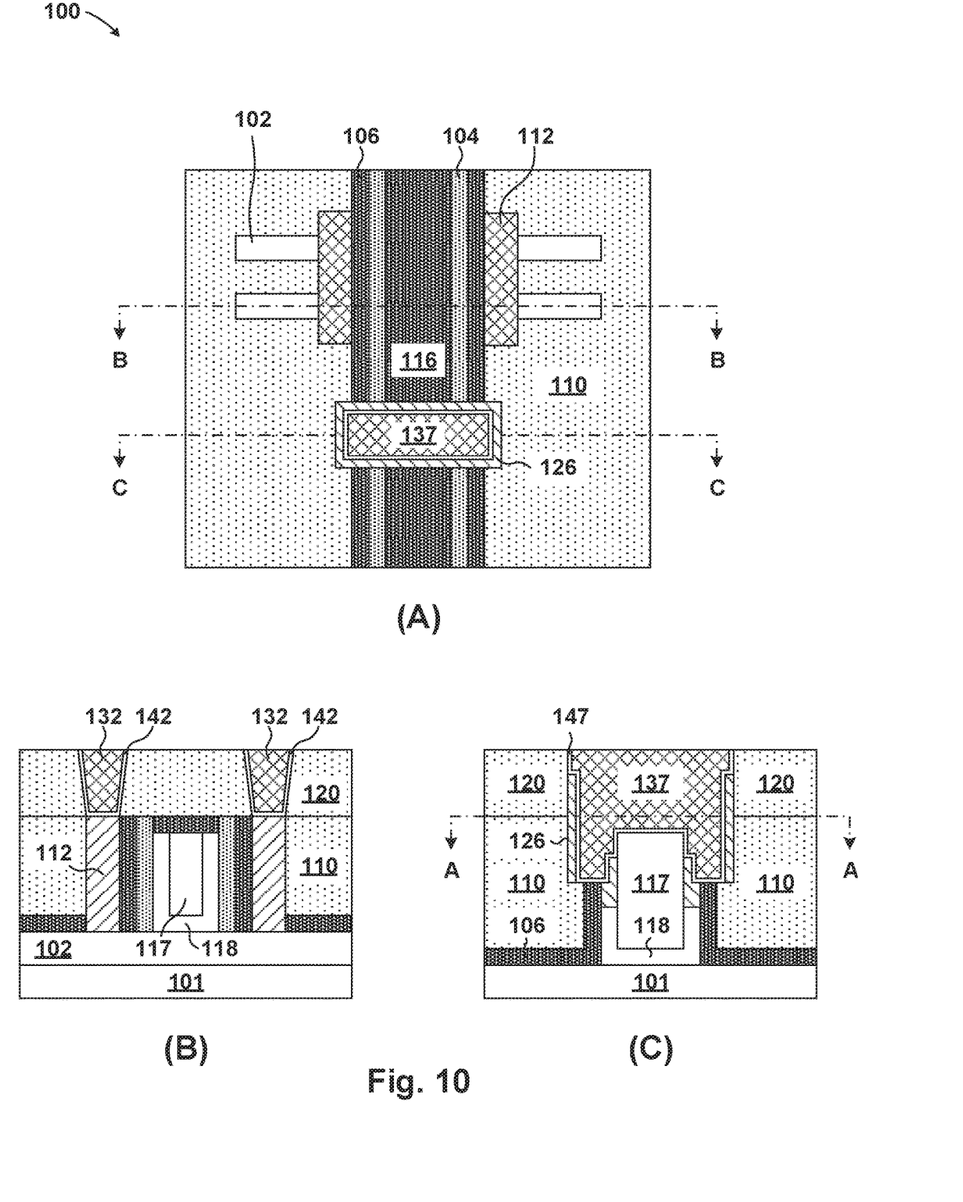
FIG. 10 is the cross section views of the semiconductor structure and illustrates the formation of a fin contact and a gate contact, according to an exemplary embodiment.

FIG. 10 is a demonstrative illustration of the structure 100 during an intermediate step of fabrication, according to one or more embodiments of the present invention. More specifically, a second fin contact 132 and a gate contact 137 may be formed in the fin contact trench 131 and the gate contact trench 119, respectively.

The second fin contact 132 and the gate contact 137 may be formed using one or more deposition techniques known in the art, such as, for example, atomic layer deposition (ALD), molecular layer deposition (MLD), chemical vapor deposition (CVD), in-situ radical assisted deposition, metalorganic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof. The second fin contact 132 and the gate contact 137 may be polished using any polishing technique known in the art, such as, for example, a CMP process, such that a top surface of the second fin contact 132 and the gate contact 137 are coplanar with a top surface of the second ILD 120. The second fin contact 132 and the gate contact 137 may include any conductive material known in the art, such as, for example, tungsten, copper, aluminum, silver, gold, alloys thereof, and any suitable combination thereof. In an embodiment, the second fin contact 132 and the gate contact 137, are formed during a single deposition process and are copper.

In an embodiment, a fin contact liner 142 and a gate contact liner 147 may be formed between the second fin contact 132 and the gate contact 137 and their respective trenches, as is known in the art. The fin contact liner 142 and the gate contact liner 147 may include any liner materials known in the art, such as, for example, Ta/TaN. The fin contact 132 may be deposited directly on the fin contact liner 142. The gate contact 137 may be formed directly the gate contact liner 147, such that the protective liner 126 separates the gate dielectric 118 and the gate contact 137 (and gate contact liner 147). The separation of the gate dielectric 118 and the gate contact 137 by the protective liner 126 (e.g., SiN) can help prevent reliability issues. Additionally, this embodiment provides a fin contact and gate contact having the same material (e.g., Cu) allowing for easier integration (i.e., one metallization step and one contact CMP step). Furthermore, gate contact resistance is reduced by the introduction of copper (replacing W, Co, etc.).

Figure 11:
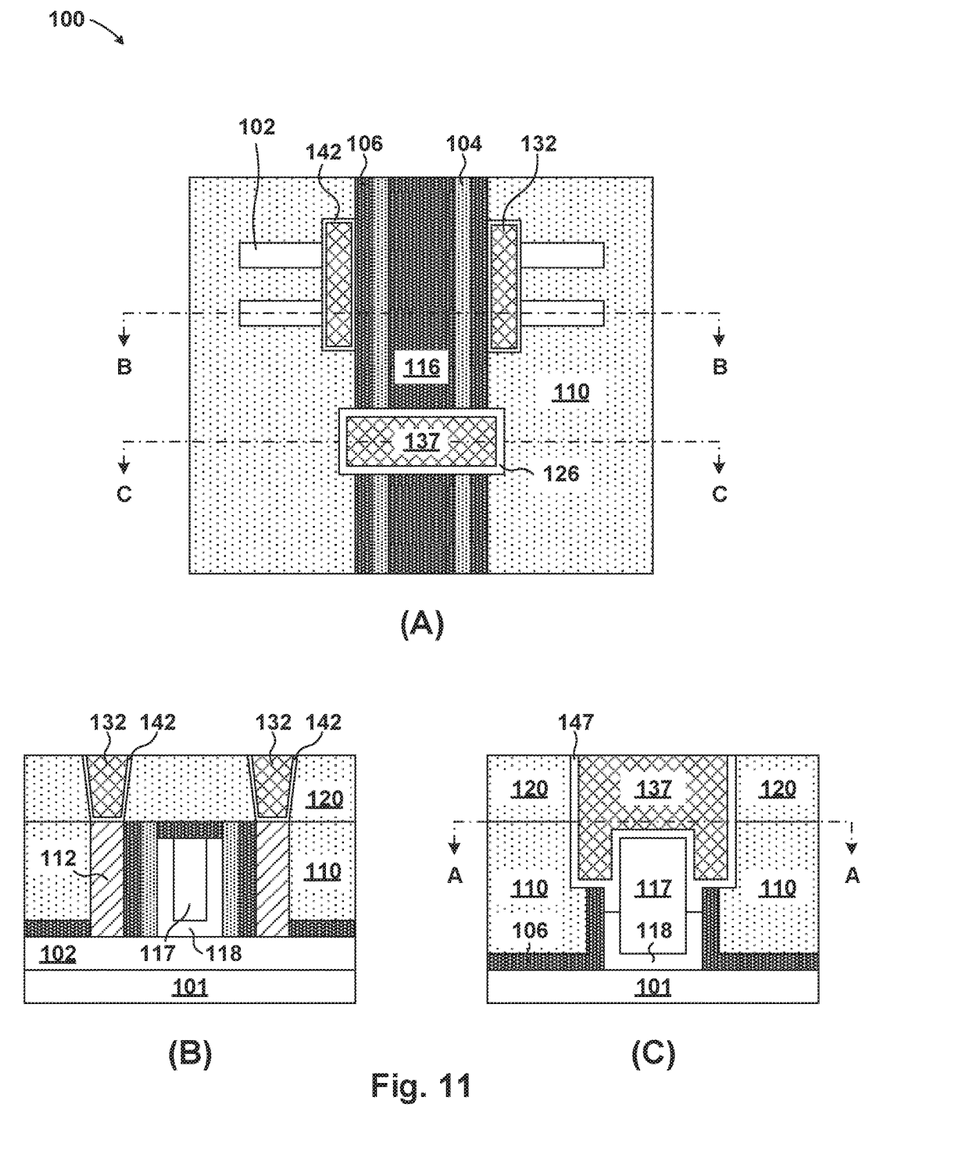
FIG. 11 includes cross section views of an alternative semiconductor structure and illustrates the use of a gate contact liner to pinch off the protective trench, according to an exemplary embodiment.

FIG. 11 is a demonstrative illustration of a structure 300 during an intermediate step of fabrication, according to one or more embodiments of the present invention. More specifically, the gate liner 147 may be used instead of the protective liner 126 to pinch off the protective trench 129. The gate liner 147 may have a thickness great enough to pinch off the protective trench 129 (e.g., having a thickness≥half the thickness of the gate dielectric 118). In this embodiment, the gate liner 147 may provide the protection against copper poisoning by providing a buffer between the gate contact 137 and the gate dielectric 118.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    forming a finFET structure including a dummy gate on one or more fins, a gate spacer on sidewalls of the dummy gate, an outer liner on the gate spacer and on the fins, and a first inter-layer dielectric on the outer liner;
    removing the gate spacer from at least a gate contact region;
    replacing the dummy gate with a replacement metal gate, the replacement metal gate includes a metal gate and a gate dielectric, the gate dielectric is between the metal gate and the fins and between the metal gate and the outer liner;
    forming a first fin contact through the first inter-layer dielectric and the outer liner, the first fin contact is in direct connection with the fins;
    forming a gate contact trench by recessing the first inter-layer dielectric, the gate dielectric, and the outer liner in the gate contact region, the gate contact trench exposes the top surface of the metal gate;
    forming a protective trench in the gate contact trench by recessing the gate dielectric exposing a portion of the metal gate sidewalls;
    forming a protective liner in the protective trench; and
    forming a gate contact in the gate contact trench, the gate contact is directly on the metal gate, and the protective liner is between the metal gate and the gate dielectric.

2. The method of claim 1, wherein the protective liner is SiN.

3. The method of claim 2, further comprising:
    forming the protective liner on all surfaces in the gate contact trench; and
    etching the protective liner from the top surface of the metal gate.

4. The method of claim 1, further comprising:
forming a second inter-layer dielectric in at least a fin contact region and the gate contact region;
forming a fin contact trench in the second inter-layer dielectric exposing the top surface of the first fin contact; and
forming a second fin contact in the fin contact trench.

5. The method of claim 4, wherein the second fin contact and the gate contact are formed during a single contact formation step.

6. The method of claim 1, further comprising:
forming a gate contact liner between the gate contact and the metal gate.

7. The method of claim 6, wherein the gate contact liner includes the protective liner.

8. The method of claim 7, wherein the gate contact liner includes at least tantalum.

9. The method of claim 1, wherein the gate contact is copper.

10. The method of claim 1, wherein the gate spacer is a high-k material.

11. A method comprising:
forming a finFET structure including a dummy gate on one or more fins, a gate spacer on sidewalls of the dummy gate, an outer liner on the gate spacer and on the fins, and a first inter-layer dielectric on the outer liner;
forming a dummy gate trench by removing the dummy gate;
forming a replacement metal gate in the dummy gate trench, the replacement metal gate includes a metal gate and a gate dielectric, the gate dielectric is between the metal gate and the fins and between the metal gate and the outer liner;
forming a gate contact trench by recessing at least the first inter-layer dielectric, the gate dielectric, and the outer liner in a gate contact region, the gate contact trench exposes the top surface of the metal gate;
forming a protective trench in the gate contact trench by recessing at least the gate dielectric exposing a portion of the metal gate sidewalls;
forming a protective liner in the protective trench; and
forming a gate contact in the gate contact trench, the gate contact is directly on the metal gate, and the protective liner is between the gate contact and the gate dielectric.

12. The method of claim 11, wherein forming the protective trench includes recessing the gate spacer in the gate contact region.

13. The method of claim 11, further comprising:
forming the protective liner on all surfaces in the gate contact trench; and
etching the protective liner from the top surface of the metal gate.

14. The method of claim 11, further comprising:
forming a gate contact liner between the gate contact and the metal gate.

15. The method of claim 14, wherein the gate contact liner includes the protective liner.

16. The method of claim 15, wherein the gate contact liner includes at least tantalum, the gate contact is copper, and the gate spacer is a high-k material.

17. The method of claim 11, further comprising:
forming a first fin contact through the first inter-layer dielectric and the outer liner, the first fin contact is in direct connection with the fins, and the first fin contact is between two adjacent replacement metal gates.

* * * * *